United States Patent
Marinas et al.

(10) Patent No.: US 8,212,617 B2
(45) Date of Patent: Jul. 3, 2012

(54) FAST CLASS AB OUTPUT STAGE

(75) Inventors: Alberto Marinas, El Puig (ES);
Santiago Iriarte, Valencia (ES); Colm Donovan, Valencia (ES); Eduardo Martinez, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/652,442

(22) Filed: Jan. 5, 2010

(65) Prior Publication Data

US 2011/0163811 A1 Jul. 7, 2011

(51) Int. Cl.
*H03F 3/18* (2006.01)
(52) U.S. Cl. .......................................... 330/264
(58) Field of Classification Search .................. 330/255, 330/262–274
See application file for complete search history.

(56) References Cited

U.S. PATENT DOCUMENTS

| | | | |
|---|---|---|---|
| 5,442,320 A | 8/1995 | Kunst et al. | |
| 5,598,129 A | 1/1997 | Chambers | |
| 5,621,357 A * | 4/1997 | Botti et al. | 330/253 |
| 6,734,720 B2 * | 5/2004 | Imai et al. | 327/560 |
| 6,788,147 B1 | 9/2004 | Lubbers | |
| 6,930,551 B2 | 8/2005 | Ivanov et al. | |
| 7,235,483 B2 | 6/2007 | Ivanov et al. | |
| 7,285,942 B2 | 10/2007 | Man et al. | |
| 7,466,201 B1 | 12/2008 | Ivanov et al. | |
| 2002/0109548 A1 * | 8/2002 | Hosokawa | 330/264 |

OTHER PUBLICATIONS

International Search Report and Written Opinion for PCT/US2010/0060189 mailed on Feb. 10, 2011.

* cited by examiner

*Primary Examiner* — Hieu Nguyen
(74) *Attorney, Agent, or Firm* — Kenyon & Kenyon LLP

(57) ABSTRACT

A system for a Class AB Amplifier output stage that includes a first push pull system connected to an output terminal including a first driving transistor coupled to the output terminal and a second push pull system connected to the output terminal including a second driving transistor coupled to the output terminal. The amplifier also includes a current mode amplifier where the current mode amplifier's output is coupled to the first driving transistor's gate. The amplifier further includes a pair of resistors, a first resistor coupled to a first input terminal of the current mode amplifier, a second resistor coupled to a second input terminal of the current mode amplifier and coupled to the second driving transistor.

13 Claims, 5 Drawing Sheets

100

120

300

320

500

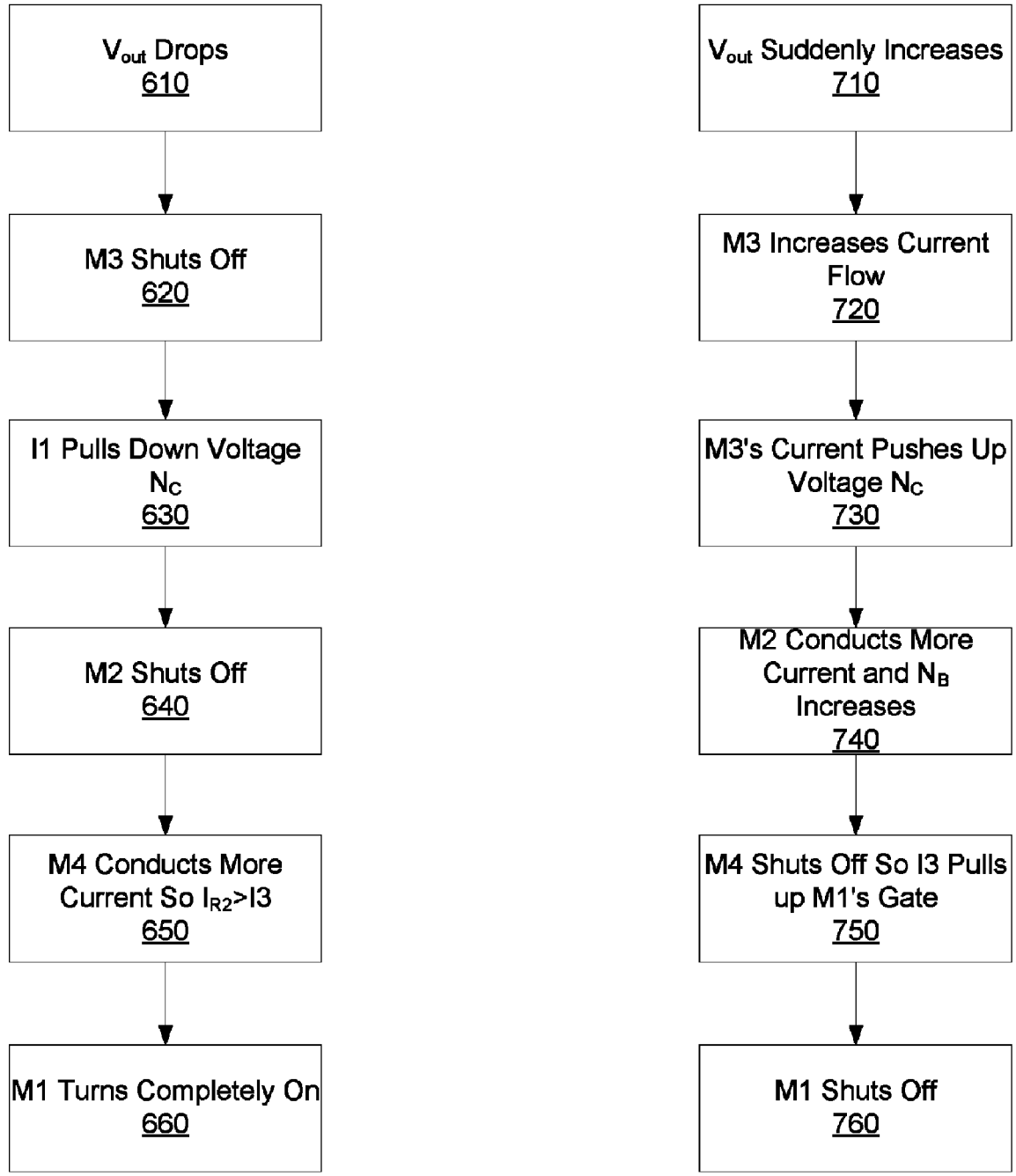

FAST CLASS AB OUTPUT STAGE

BACKGROUND

The present invention relates to Class AB amplifiers for internal Low Drop-Out (LDO) circuits. In particular, it relates to improving power supply range of Class AB amplifier output stages.

Class AB amplifiers generally have a complimentary pair of push-pull arrangement where each half of the input signal is individually amplified by one of the push-pull pairs respectively. In some designs, to reduce distortion between the two separate amplified halves, both push-pull pairs are never completely turned off but are designed to have some current flowing even when not amplifying the input signal. The constant powering of the push-pull arrangement reduces distortion in the amplified signal by creating an overlap of the two amplified halves. However, this technique requires a constant supply of power and, therefore, Class AB amplifier designs are generally considered power inefficient.

Along with efficient power consumption, Class AB amplifier designers are concerned with glitch compensation. Glitches represent a sudden change in voltage at an output terminal of an amplifier even though an input voltage remains unchanged. They can occur, for example, when a load impedance at the amplifier's output changes suddenly. In order to compensate for glitches, capacitors can be placed at the amplifier output. However, a capacitor positioned at the amplifier output must be relatively large in order to have enough charge to compensate for glitches thus the capacitor can take up an overwhelming amount of space on the circuit board.

Another option is to position the dominant pole of the amplified signal at an intermediate stage and have a compensating amplifier at the output stage to compensate for glitches. For example, FIG. 1 is a block diagram of a known amplifier system 100. The system 100 includes a first amplifier 110 and a compensating amplifier 120 that provides glitch compensation.

However, compensating amplifiers generally require large power supply voltages to react to glitches. For example, FIG. 2 is a circuit diagram of a known compensating amplifier 120 that requires a large supply voltage $V_{DD}$. The compensating amplifier 120 includes two push-pull transistors M1, M2 that are both coupled to the output $V_{out}$. The compensating amplifier 120 also includes an input transistor M3 that is coupled to the input signal $V_{Intermediate}$, the output signal $V_{out}$ and a current mode amplifier 210. The current mode amplifier 210 includes a diode connected transistor M5 and transistor M4. The current mode amplifier's 210 inputs are coupled to the second push-pull transistor M2 and another diode connected transistor M5'. Since M5 and M5' are coupled in series, $V_{DD}$ must at least be greater than the sum of each transistor's voltage threshold $V_{TH}$, which is the voltage required to turn on the transistor, plus some amount of headroom for current source 12. The two cascading diode connected transistors M5, M5' make the compensating amplifier 120 require a large supply voltage thus limiting the applications of the circuit to high power supplies. Accordingly, there is a need in the art for fast reacting Class AB output stages that operate on low power supplies.

BRIEF DESCRIPTION OF THE DRAWINGS

FIG. 6 is a simplified process flow for current boosting to compensate for a negative glitch.
FIG. 7 is a simplified process flow for current boosting to compensate for a positive glitch.

DETAILED DESCRIPTION

Embodiments of the present invention provide an amplifier that includes a first push pull system connected to an output terminal including a first driving transistor coupled to the output terminal and a second push pull system connected to the output terminal including a second driving transistor coupled to the output terminal. The amplifier also includes a current mode amplifier where the current mode amplifier's output is coupled to the first driving transistor's gate. The amplifier further includes a pair of resistors, a first resistor coupled to a first input terminal of the current mode amplifier, a second resistor coupled to a second input terminal of the current mode amplifier and coupled to the second driving transistor.

Embodiments of the present invention provide an amplifier that includes an input transistor coupled to an amplifier input and an amplifier output and a first current source coupled to the input transistor. The amplifier also includes a first push pull transistor coupled to the amplifier output and a second push pull transistor coupled to the amplifier output. The amplifier further includes a current mode amplifier coupled to a pair of resistors and to the first push pull transistor, wherein a first resistor is coupled to a first terminal of the current mode amplifier and a second resistor is coupled to a second terminal of the current mode amplifier, and wherein the second resistor is further coupled to the second push pull transistor.

Figure 1:
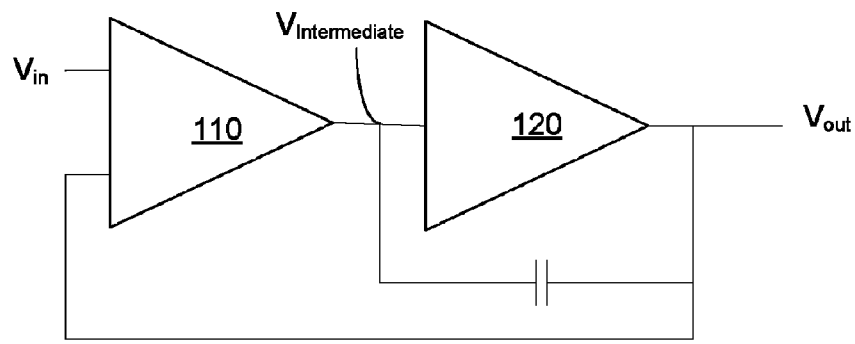
FIG. 1 is a block diagram of a known amplifier system.
Figure 2:
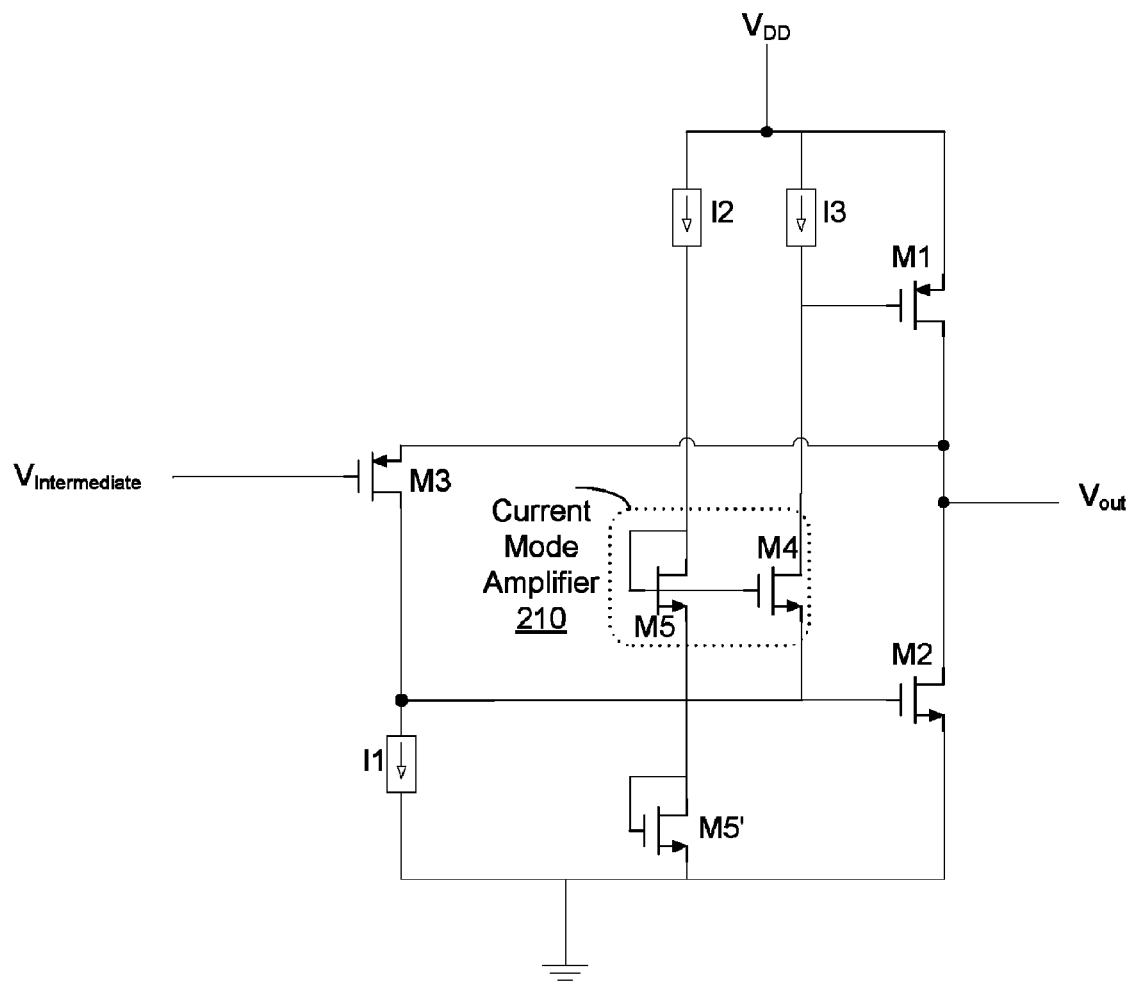
FIG. 2 is a circuit diagram of a known compensating amplifier.
Figure 3:
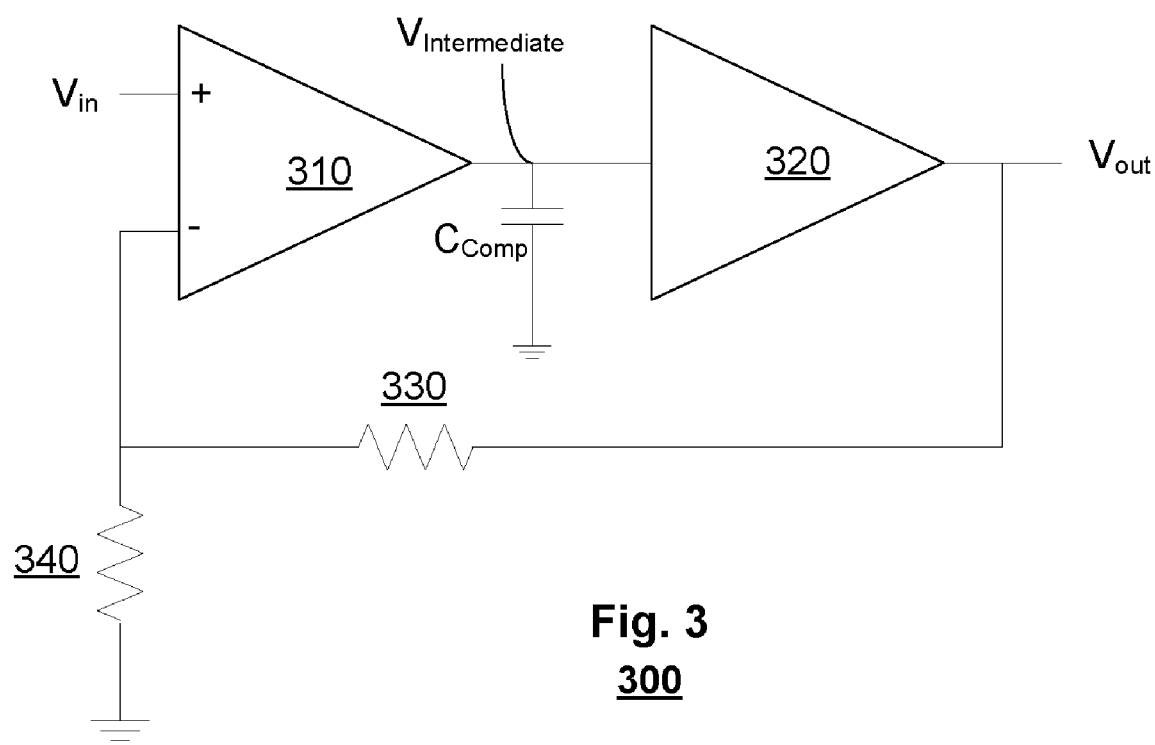
FIG. 3 is a block diagram of an amplifier system according to an embodiment of the present invention.

FIG. 3 is a block diagram of a class AB amplifier system 300 according to an embodiment of the present invention. The system 300 may include a first amplifier 310 that receives an input signal $V_{in}$ at a non-inverting terminal. The first amplifier 310 may be a high gain amplifier that provides most of the overall gain in amplifier system 100. The first amplifier 310 may produce an output signal $V_{intermediate}$ with the dominant pole located at $V_{intermediate}$. The first amplifier's 310 output may be coupled to a compensating capacitor $C_{Comp}$ and an output stage amplifier 320 to generate the final output signal $V_{out}$. Gain resistors 330, 340 may be coupled to first amplifier's 110 inverting terminal and output stage amplifier's 320 output. Output stage amplifier 320 may be a fast operating amplifier to compensate for glitches in the system 300.

Figure 4:
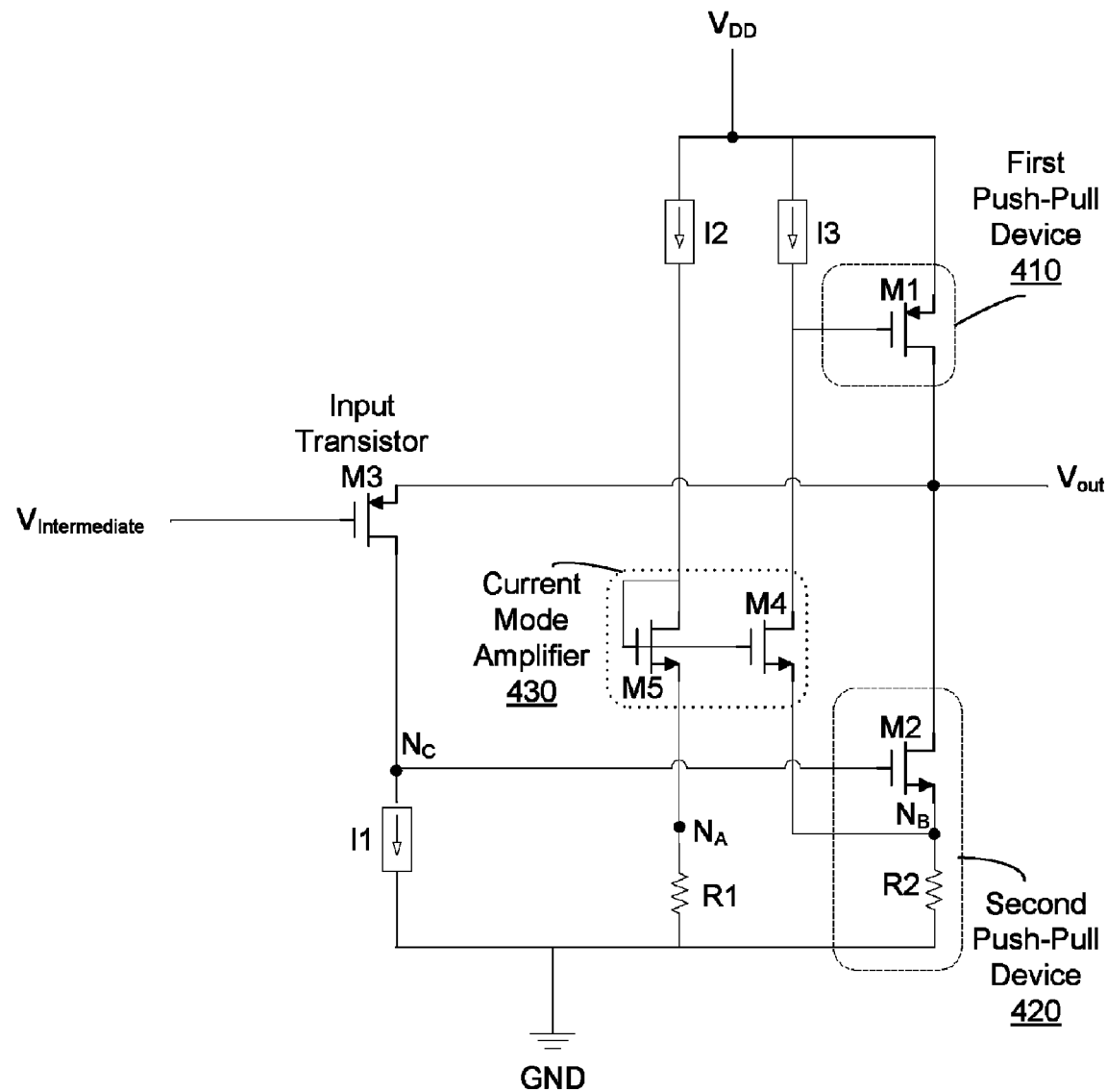
FIG. 4 is a circuit diagram of an output stage amplifier according to an embodiment of the present invention.

FIG. 4 is a circuit diagram of the output stage amplifier 320 according to an embodiment of the present invention. The output stage amplifier 320 may include a first push-pull device 410 and a second push-pull device 420. The two push-pull devices 410, 420 may be complimentary to each other and both may be coupled to $V_{out}$. The first push-pull device 410 may include a driving transistor M1, where M1 may be coupled to $V_{out}$. The first push-pull device 410 may also be connected to a reference supply voltage $V_{DD}$.

The second push-pull device 420 may include a driving transistor M2, where M2 may be coupled to $V_{out}$. The second push-pull device 420 may also include a resistor R2 coupled to M2. The second push-pull device 420 may be connected to a reference ground voltage GND.

The output stage amplifier 320 may also include a current mode amplifier 430. The current mode amplifier 430 may include a diode connected transistor M5 and transistor M4. The current mode amplifier's 430 outputs may be coupled to current sources 12, 13 and driving transistor M1 as shown in FIG. 4. to provide current boost capabilities. In another embodiment, the current mode amplifier 430 may include the current sources 12, 13.

The output stage amplifier 320 may further include two resistor R1, R2 that are coupled to current mode amplifier 430 inputs. R1 may be coupled to M5, and R2 may be coupled to M4. In order to manipulate currents in the circuit, R1 may be larger than R2. For example, R1 may be twice as large as R2 or R1 may be ten times as large as R2. Since the voltage at the inputs of the current mode amplifier at nodes $N_A$ and $N_B$ may be the same at all times, the corresponding voltage drops across resistors R1, R2 may be the same. Consequently, the currents flowing through the resistors may depend on the size of the resistors R1, R2. In another embodiment, the resistors R1, R2 may be the same value while current sources 12, 13 may be set to different values in order to manipulate the currents.

The output stage amplifier 320 may also include an input transistor M3 that may receive $V_{Intermediate}$. M3 may also be coupled to $V_{out}$ and a current source I1. At node $N_C$, the current between M3 and I1 may drive M2 as M2's gate may be coupled to node $N_C$. In another embodiment, current sources I1, I2, and I3 may be replaced by resistors. Furthermore, in another embodiment, current sources I1, I2, and I3 may each be coupled to a resistor in parallel.

As shown in FIG. 4, supply voltage $V_{DD}$ need only be large enough to drive current mode amplifier 430 and supply a voltage drop across resistor R1. The current mode amplifier 430 may be driven by supplying a voltage greater than the threshold voltage $V_{TH}$ at M5's gate, which may be coupled to $V_{DD}$. Consequently, M5 may be the only diode connected transistor in a current path connecting $V_{DD}$ to ground. Accordingly, when the voltage drop across resistor R1 is less than $V_{TH}$, then $V_{DD}$ may be less than $2V_{TH}$. Therefore, output stage amplifier 320 may operate on much lower supply voltages than prior systems.

In normal operations, M1 and M2 may be ON at all times. Even when either transistor is not amplifying the input signal, that transistor may conduct some current flow in order to react quickly to glitches. A glitch may occur when $V_{out}$ suddenly changes state. For example, $V_{out}$ may be coupled to a digital block where a positive or negative glitch may be generated.

Figure 5:
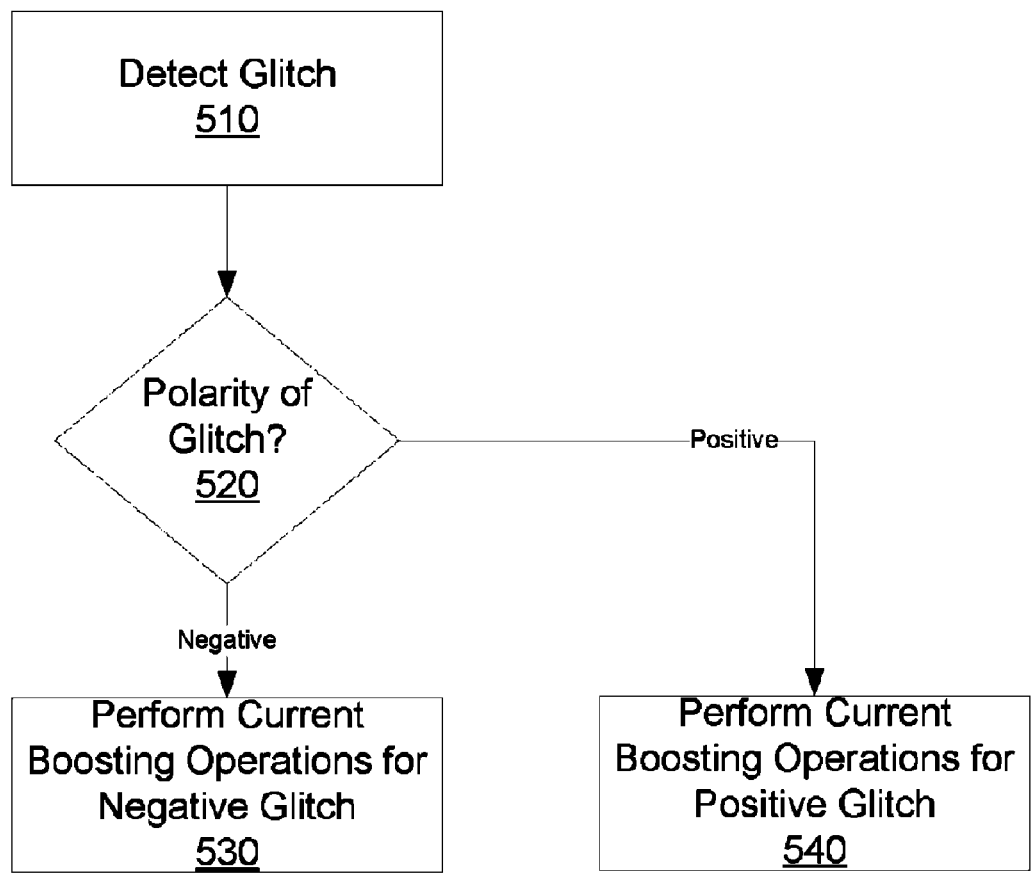
FIG. 5 is a simplified process flow for reacting to glitches.

FIG. 5 is a simplified flow diagram of a circuit operation 500 reacting to glitches. The circuit operation 500 may include detecting the glitch at the output stage (block 510). The circuit operation 500 may check whether the glitch is a positive or negative glitch (block 520). If the glitch is a negative glitch, current boosting operations to compensate for the negative glitch may be performed (block 530). Conversely, if the glitch is a positive glitch, current boosting operations to compensate for the positive glitch may be performed (block 540). Current boosting operations may last for the duration of the glitch and may stop at the conclusion of the glitch when output stage amplifier 320 may return to normal operations.

The current boosting operations for a negative glitch according to an embodiment of the present invention are further described in FIG. 6. During a negative glitch, $V_{out}$ may drop (block 610). Since $V_{out}$ is coupled to the source node of M3, M3 may shut off when $V_{out}$ drops (block 620). M3 shutting off may cause I1 to pull down its voltage at node $N_C$ because it is coupled to M3 (block 630). Since M2's gate is driven by node $N_C$'s pulled down voltage, M2 may completely turn off (block 640). With M2 completely turned off, M4 may conduct more current (block 650). The current $I_{R2}$ may be boosted to a point that it becomes greater than I3. When $I_{R2}$ becomes greater than I3, the boosted current may flow to the gate of M1 causing M1 to conduct more current (block 660). With M2 completely off and M1 conducting more current, M1 pushes voltage into $V_{out}$ thereby compensating for the negative glitch.

The current boosting operations for a positive glitch according to an embodiment of the present invention are further described in FIG. 7. During a positive glitch, $V_{out}$ may suddenly increase (block 710). Since $V_{out}$ is coupled to the source node of M3, M3 may increase its current flow pushing up voltage at node $N_C$ (block 720 and 730). Since M2's gate is driven by node $N_C$'s pushed up voltage, M2 may conduct more current (block 740). With M2 conducting more current, the voltage drop across R2 may increase causing M4 to turn completely off (block 750). Correspondingly, 13 may pull up the gate of M1 causing M1 to completely turn off (block 760). With M1 completely off and M2 conducting more current, M2 pulls down $V_{out}$ thereby compensating for the positive glitch.

Several embodiments of the present invention are specifically illustrated and described herein. However, it will be appreciated that modifications and variations of the present invention are covered by the above teachings and within the purview of the appended claims without departing from the spirit and intended scope of the invention. Additionally, it will be appreciated that the present invention is not limited by the specific transistor types described above or depicted in the drawings but other transistor types may be used in the present invention without departing from the spirit and intended scope of the invention.

We claim:

1. An amplifier, comprising:
   a first push pull system connected to an output terminal including a first driving transistor coupled to the output terminal;
   a second push pull system connected to the output terminal including a second driving transistor coupled to the output terminal;
   a current mode amplifier, the current mode amplifier's output coupled to the first driving transistor's gate; and
   a pair of resistors, a first resistor coupled to a first input terminal of the current mode amplifier, and a second resistor coupled to a second input terminal of the current mode amplifier and coupled to the second driving transistor, wherein the first resistor is larger than the second resistor.

2. The amplifier of claim 1, wherein the current mode amplifier comprises a diode transistor and another transistor.

3. The amplifier of claim 2, wherein the current mode amplifier further comprises a pair of current sources.

4. The amplifier of claim 1, wherein the amplifier is a class AB amplifier.

5. The amplifier of claim 1 further comprising at least one current source.

6. The amplifier of claim 1 further comprising at least one other resistor.

7. The amplifier of claim 1 further comprising a current source and a current resistor coupled in parallel.

8. An amplifier comprising:
   an input transistor coupled to an amplifier input and an amplifier output;
   a first current source coupled to the input transistor;
   a first push pull transistor coupled to the amplifier output;
   a second push pull transistor coupled to the amplifier output; and a current mode amplifier coupled to a pair of resistors and to the first push pull transistor, wherein a first resistor is coupled to a first terminal of the current mode amplifier and a second resistor is coupled to a second terminal of the current mode amplifier, and wherein the second resistor is further coupled to the second push pull transistor.

9. The amplifier of claim 8, wherein the first resistor is larger than the second resistor.

10. The amplifier of claim 8, wherein the current mode amplifier comprises a diode transistor and another transistor.

11. The amplifier of claim 8, wherein the first current source is a resistor.

12. The amplifier of claim 8, wherein the first current source comprises a resistor and a current source coupled in parallel.

13. The amplifier of claim 8, wherein the amplifier is a class AB amplifier.

* * * * *